United States Patent [19]

Schreck

[11] Patent Number: 5,170,077
[45] Date of Patent: Dec. 8, 1992

[54] VOLTAGE LEVEL DETECTING CIRCUIT

[75] Inventor: John F. Schreck, Houston, Tex.

[73] Assignee: Texas Instruments Incorporated, Dallas, Tex.

[21] Appl. No.: 583,619

[22] Filed: Sep. 14, 1990

[51] Int. Cl.[5] .................. H03K 5/153; H03K 17/687; G11C 11/00
[52] U.S. Cl. .................................... 307/362; 307/571; 307/296.5
[58] Field of Search ...................... 307/571, 362, 296.1, 307/296.3, 296.5

[56] References Cited

U.S. PATENT DOCUMENTS 4,709,165 11/1987 Higuchi et al. ................. 307/296.5
4,716,323 12/1987 Wada et al. ........................ 307/362

FOREIGN PATENT DOCUMENTS 51317 3/1985 Japan .................................. 307/362
256819 11/1986 Japan .................................. 307/571

OTHER PUBLICATIONS

Easter "Voltage Monitor Circuit" Technical Notes RCA Sep. 8, 1980, TN No. 1240.

Primary Examiner—Eugene R. LaRoche
Assistant Examiner—Michael B. Shingleton
Attorney, Agent, or Firm—Ronald O. Neerings; James C. Kesterson; Richard L. Donaldson

[57] ABSTRACT

A voltage level detecting circuit is presented having simplistic construction, stable circuit operation and few components. The circuit includes: a p-channel transistor; a resistor; a ground terminal; a first voltage supply terminal for receiving a fixed voltage level; a second voltage supply terminal for receiving a variable voltage level; and an output terminal.

9 Claims, 1 Drawing Sheet

VOLTAGE LEVEL DETECTING CIRCUIT

FIELD OF THE INVENTION

This invention relates to a voltage level detecting circuit, and more particularly, to a voltage level detecting circuit for detecting whether a voltage supplied to a semiconductor device is high or low.

BACKGROUND OF THE INVENTION

Semiconductor memory devices often require that two voltages be supplied to the device The first voltage is from a fixed voltage supply Vcc and the second voltage is from a variable voltage supply Vpp set to a high voltage level when programming and a low voltage when reading. A voltage level detecting circuit detects whether the variable voltage supply is at the high or low voltage level. The output voltage level of the detecting circuit sets the operation of the memory device to either programming modes or reading modes. Existing prior art voltage detecting circuits tend to suffer, however, from at least one of the following three problems: 1) the construction of the circuit is difficult; 2) it is difficult to achieve stable circuit operation; 3) a large number of components are required for the circuit. The first two problems arise when both depletion and enhancement mode transistors are used in the circuit and the ratio of the dimension of the first depletion type transistor and the first enhancement type transistors must be selected to be a predetermined value. One prior art circuit counters problems 1 and 2 by replacing a second depletion type transistor connected between the fixed voltage supply and a second enhancement type transistor with a group of enhancement type transistors which exacerbates problem 3.

An attempt is made by Higuchi et al. in U.S. Pat. No. 4,709,165 (1987) to disclose a circuit having a simplistic construction and few components. The Higuchi circuit discloses a voltage supply level detecting circuit comprising: a first voltage supply terminal receiving a fixed voltage level; a second voltage supply terminal receiving a variable voltage level being set at a high voltage level or low voltage level; a ground terminal; a first MIS transistor of one conductivity type; and a second MIS transistor of an opposite conductivity type. The first and second MIS transistors are connected in series between the second voltage supply terminal and the ground terminal. The gates of the first and second MIS transistors are both connected to the first voltage supply terminal The level of the junction between the first and second MIS transistors is used for detecting whether the high voltage level or the low voltage level is applied to the second voltage supply terminal.

While Higuchi solves many of the prexisting problems with voltage level detecting circuits, there is still a need for a voltage level detecting circuit with the advantages of Higuchi but where the current between the variable voltage supply to ground is more closely a function of Vcc than the conductance of the second MIS transistor of Higuchi which is greatly affected by Vcc. There is also a need for the current between the variable voltage supply and ground to be less process sensitive than the current in the Higuchi circuit.

SUMMARY OF THE INVENTION

An objective of the present invention is to provide a voltage level detecting circuit having a small number of elements. Another objective of the present invention is to provide a voltage level detecting circuit having a current that is less process sensitive to a variable voltage supply as compared to existing circuits. A further objective of the present invention is to provide a voltage level detecting circuit having a current that is less closely a function of Vcc as compared to existing circuits.

In accordance with one embodiment of the invention, there is provided a voltage level detecting circuit, comprising: a first voltage supply terminal receiving a fixed voltage level; a second voltage supply terminal receiving a variable voltage level; a p-channel MOS transistor and a resistor. The p-channel MOS transistor and the resistor are connected in series between the second voltage supply terminal and the ground terminal. The gate of the p-channel MOS transistor is connected to the first voltage supply terminal The level of a junction between the p-channel MOS transistor and the resistor is used to detect whether a high voltage level or a low voltage level is being applied to the second voltage supply terminal

BRIEF DESCRIPTION OF THE DRAWINGS

The novel features believed characteristic of the intention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENT

Figure 1:
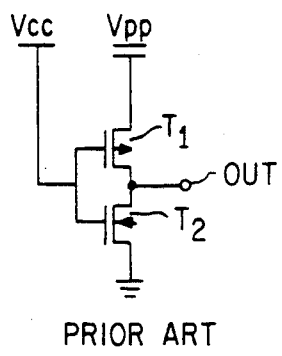
FIG. 1 is an electrical schematic diagram of a prior art voltage supply level detecting circuit.

FIG. 1 is an electrical circuit diagram of a prior art voltage supply detecting circuit The circuit of FIG. 1 is disclosed in U.S. Pat. No. 4,709,165 to Higuchi et al. In FIG. 1, T1 is a P-channel transistor and T2 is an N-channel transistor. T1 and T2 are enhancement type MIS transistors. Transistors T1 and T2 are connected in series between the variable voltage supply Vpp and ground. The gates of transistors T1 and T2 are both connected to the fixed voltage supply Vcc. The junction of transistors T1 and T2 is connected to the output OUT.

When the variable voltage supply is at a low level, i.e., Vpp=Vcc=5V, the transistor T1 is turned off because the gate-source voltage of the transistor T1 is 0V, and the transistor T2 is turned on because the gate-source voltage of the transistor T2 is more than the threshold voltage. As a result, the output OUT has a low level. When the variable voltage supply Vpp is at a high level, i.e., Vpp=21V, the transistors T1 and T2 are both turned on, because the gate-source voltage of transistor T1, i.e., (Vpp-Vcc), is greater that the threshold voltage $V_{THP}$ of transistor T1. In this case, the level of the output OUT is determined by the ratio of the conductance gm of the transistors T1 and T2. Therefore, by selecting an appropriate value for this ratio, the output OUT will have a "high" level. The circuit thus detects whether variable voltage supply Vpp is higher than (Vcc+$V_{THP}$) or not.

Figure 2:
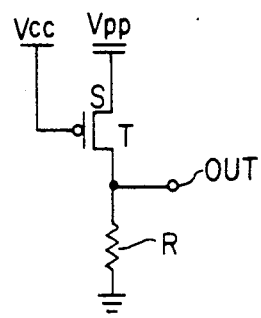
FIG. 2 is an electrical schematic diagram of a voltage level detecting circuit according to an embodiment of the present invention.

A voltage level detecting circuit in accordance with an embodiment of the present invention is illustrated in FIG. 2. The voltage level detecting circuit of FIG. 2 is a basic embodiment of the present invention. A p-channel transistor T and a resistor R are connected in series between the variable voltage supply Vpp and ground. The gate of transistor T is connected to fixed voltage supply Vcc. The junction of transistor T and resistor R is connected to output OUT.

The circuit of FIG. 2 operates as follows: when the variable voltage supply is at a low level, i.e., Vpp<Vcc+ threshold voltage $V_{THP}$ of transistor T, transistor T is off because the gate-source voltage of transistor T is less than the threshold voltage $V_{THP}$ of transistor T. As a result, output OUT has a low level. Conversely, when the variable voltage supply at a high level, i.e., Vpp>Vcc+ threshold voltage $V_{THP}$ of transistor T, transistor T is on and output OUT has a high level.

Figure 3:
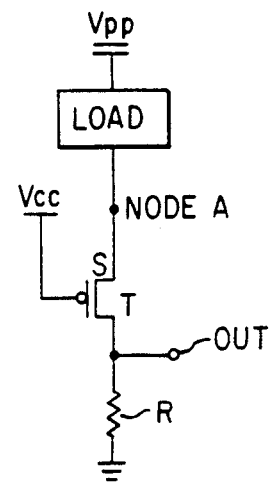
FIG. 3 is an electrical schematic diagram of a voltage level detecting circuit according to a second embodiment of the present invention.

In another embodiment of the present invention, FIG. 3, a load (LOAD) is placed between variable voltage supply Vpp and transistor T. A node (NODE A) is placed between the LOAD and transistor T. The circuit of FIG. 3 operates as follows: when the voltage at the node (NODE A) is at a low level, i.e., <Vcc+ threshold voltage $V_{THP}$ of transistor T, transistor T is off because the gate-source voltage of transistor T is less than the threshold voltage $V_{THP}$ of transistor T. As a result, output OUT has a low level. Conversely, when the voltage at the node (NODE A) is at a high level, i.e., >Vcc +threshold voltage $V_{THP}$ of transistor T, transistor T is on and output OUT has a high level.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A voltage level detecting circuit, comprising:
   a p-channel transistor;
   a ground terminal;
   a resistor connected between one of a source/drain of said p-channel transistor and said ground terminal;
   a first voltage supply terminal for receiving a fixed voltage level, said first voltage supply terminal being coupled to the gate of said p-channel transistor;
   a second voltage supply terminal for receiving a variable voltage level, said second voltage supply terminal being coupled to the other of the source/drain of said p-channel transistor;
   said variable voltage level having a first voltage level higher than a combination of said fixed voltage level and the threshold voltage of said p-channel transistor and a second voltage level lower than the combination of said fixed voltage level and the threshold voltage of said p-channel transistor; and
   an output terminal operatively connected between said p-channel and said resistor.

2. A device according to claim 1 further including a load coupled between said second voltage supply terminal and said other of the source/drain of said p-channel transistor.

3. A device according to claim 2 wherein said load is a combination of elements.

4. A device according to claim 2 wherein said load is a diode.

5. A device according to claim 1 wherein said fixed voltage level is 5 volts.

6. A device according to claim 1 wherein said transistor is a metal oxide semiconductor (MOS) transistor.

7. A voltage level detecting circuit, comprising:
   a p-channel transistor;
   a ground terminal;
   a resistor connected between one of a source/drain of said p-channel transistor and said ground terminal;
   a first voltage supply terminal for receiving a fixed voltage level, said first voltage supply terminal being coupled to the gate of said p-channel transistor;
   a second voltage supply terminal for receiving a variable voltage level, said second voltage supply terminal being coupled to a load;
   said load being coupled to the other of the source/drain of said p-channel transistor;
   said variable voltage level having a first voltage level higher than a combination of said fixed voltage level and the threshold voltage of said p-channel transistor and a second voltage level lower than a combination of said fixed voltage level and the threshold voltage of said p-channel transistor; and
   an output terminal operatively connected between said p-channel transistor and said resistor.

8. The device of claim 1 wherein said resistor is a fixed resistor.

9. The device of claim 7 wherein said resistor is a fixed resistor.